(12) United States Patent
Yuan et al.

(10) Patent No.: US 9,681,234 B2
(45) Date of Patent: Jun. 13, 2017

(54) MEMS MICROPHONE STRUCTURE AND METHOD OF MANUFACTURING THE SAME

(71) Applicant: SHANGHAI IC R&D CENTER CO.,LTD., Shanghai (CN)

(72) Inventors: Chao Yuan, Shanghai (CN); Xiaoxu Kang, Shanghai (CN); Qingyun Zuo, Shanghai (CN)

(73) Assignee: SHANGHAI IC R&D CENTER CO., LTD, Shanghai (CN)

( * ) Notice: Subject to any disclaimer, the term of this patent is extended or adjusted under 35 U.S.C. 154(b) by 0 days.

(21) Appl. No.: 14/889,433

(22) PCT Filed: Dec. 10, 2013

(86) PCT No.: PCT/CN2013/088922
§ 371 (c)(1),
(2) Date: Nov. 5, 2015

(87) PCT Pub. No.: WO2014/180131
PCT Pub. Date: Nov. 13, 2014

(65) Prior Publication Data
US 2016/0112807 A1    Apr. 21, 2016

(30) Foreign Application Priority Data

May 9, 2013    (CN) .......................... 2013 1 0167692

(51) Int. Cl.
*H04R 25/00*    (2006.01)
*H04R 19/04*    (2006.01)
(Continued)

(52) U.S. Cl.
CPC ......... *H04R 19/04* (2013.01); *B81C 1/00571* (2013.01); *H04R 19/005* (2013.01);
(Continued)

(58) Field of Classification Search
CPC ........................... H04R 19/04; H04R 2201/03
See application file for complete search history.

(56) References Cited

U.S. PATENT DOCUMENTS 5,452,268 A * 9/1995 Bernstein ............. H04R 19/005
367/181
7,152,481 B2 * 12/2006 Wang .................... B81B 3/0072
381/176
(Continued)

FOREIGN PATENT DOCUMENTS

CN    101353152 A1    1/2009
WO    2013031811 A1    3/2013

*Primary Examiner* — Curtis Kuntz
*Assistant Examiner* — Ryan Robinson
(74) *Attorney, Agent, or Firm* — Tianchen LLC.

(57) ABSTRACT

A MEMS microphone structure, comprising a semiconductor substrate having a cavity, a first dielectric layer having a through-hole communicating with the cavity, a lower diaphragm electrode formed above the through-hole and at least partially attached to the upper surface of the first dielectric layer, and an upper electrode structure with an insulating layer. The upper electrode structure comprises an annular supporter, a back plate having multiple holes, and an upper electrode connection. At least a part of the annular supporter extends downwardly to the lower diaphragm electrode while the rest of the annular supporter extends downwardly to the substrate. The back plate is suspended above the lower diaphragm electrode by the annular supporter, forming an air gap therebetween. An upper electrode is embedded in the insulating layer at the back plate and is lead out by the upper electrode connection.

19 Claims, 4 Drawing Sheets

(51) Int. Cl.
*H04R 19/00* (2006.01)
*H04R 31/00* (2006.01)
*B81C 1/00* (2006.01)
*H04S 7/00* (2006.01)

(52) U.S. Cl.
CPC ............ *H04R 31/003* (2013.01); *H04S 7/00* (2013.01); *B81B 2201/0257* (2013.01); *H04S 2420/01* (2013.01)

(56) References Cited

U.S. PATENT DOCUMENTS

| | | | | |
|---|---|---|---|---|
| 7,620,192 B2* | 11/2009 | Yamaoka | ............ | H01G 5/0136 381/174 |
| 8,327,711 B2* | 12/2012 | Kasai | ............ | H04R 19/005 73/649 |
| 8,642,485 B2* | 2/2014 | Lin | ............ | C09D 179/08 257/E21.219 |
| 8,699,728 B2* | 4/2014 | Kasai | ............ | H04R 19/04 381/173 |
| 8,787,601 B2* | 7/2014 | Suzuki | ............ | B81B 3/0072 367/163 |
| 8,803,257 B2* | 8/2014 | Kasai | ............ | B81B 3/007 257/415 |
| 8,976,985 B2* | 3/2015 | Kasai | ............ | H04R 19/04 381/174 |
| 2014/0191343 A1* | 7/2014 | Kasai | ............ | H04R 19/005 257/416 |
| 2014/0225204 A1* | 8/2014 | Nakagawa | ............ | H04R 19/04 257/416 |

* cited by examiner

MEMS MICROPHONE STRUCTURE AND METHOD OF MANUFACTURING THE SAME

CROSS-REFERENCE TO RELATED APPLICATION

This application claims the priority benefit of International Patent Application Serial No. PCT/CN2013/088,922, filed Dec. 10, 2013, which is related to and claims the priority benefit of China patent application serial No. 201310167692.4 filed May 9, 2013. The entirety of each of the above-mentioned patent applications is hereby incorporated by reference herein and made a part of this specification.

FIELD OF THE INVENTION

The present invention generally relates to the field of micro-electro-mechanical-systems, more particularly, to a MEMS microphone structure and a method of manufacturing the same.

BACKGROUND OF THE INVENTION

Types of microphones include a dynamic type and a condenser type. The conventional dynamic microphone, which is consisted of a coil, a diaphragm and a permanent magnetic, operates based on the principle that a moving coil in the magnetic field generates electric current. The condenser type microphone, which mainly comprises two capacitor plates, a diaphragm and a black plate, operates under the working principle that sound pressure induces deformation of the diaphragm and changes the capacitance between the diaphragm and the back plate, such variation of the capacitance is converted into electric signals to be output.

The MEMS microphones is one of the most successful MEMS devices so far. The MEMS microphones is manufactured by surface processing or bulk silicon processing, which is compatible with the IC manufacturing. With the continuous device scaling down made in the CMOS technology, the MEMS microphone can be manufactured with an extremely small size, which enables its widely application in portable devices like cell phones, notebook computers, tablet computers or video cameras.

The MEMS microphone is generally a condenser type microphone having a diaphragm (lower electrode) fixedly formed on a substrate, opposed to a cavity in the substrate, and a back plate (upper electrode) suspended above the diaphragm with an air gap formed therebetween. However, such arrangement has the defect that time for releasing the sacrificial dielectric between the diaphragm and the back plate for forming the air gap need to be strictly controlled, since long releasing time may cause completely removal of the sacrificial layer and result in the peel off of the diaphragm. Furthermore, acoustic holes formed in the back plate communicating with the air gap will expose portion of the upper electrode, which makes the exposed upper electrode vulnerable to strong releasing solution.

BRIEF SUMMARY OF THE DISCLOSURE

Accordingly, an objective of the present invention is to provide a MEMS microphone structure and a method of manufacturing the same, so as to effectively prevent the damage or peel off of the upper electrode and the lower diaphragm electrode during the releasing process.

In order to achieve the above objective, the present invention provides a MEMS microphone structure comprising: a semiconductor substrate having a cavity therein; a first dielectric layer formed on the semiconductor substrate having a through-hole communicating with the cavity; a lower diaphragm electrode formed above the through-hole and at least partially attached to the upper surface of the first dielectric layer, wherein the lower diaphragm electrode is lead out through a lower electrode connection; an upper electrode structure with an insulating layer, wherein the upper electrode structure comprises an annular supporter, a back plate having multiple holes, and an upper electrode connection. At least a part of the annular supporter extends downwardly to the lower diaphragm electrode while the rest of the annular supporter extends downwardly to the substrate. The back plate is suspended above the lower diaphragm electrode by the annular supporter, forming an air gap therebetween. An upper electrode is embedded in the insulating layer at the back plate and is lead out by the upper electrode connection.

Alternatively, the annular supporter is an annular trench.

Alternatively, the annular trench comprises a first portion formed outside the lower diaphragm electrode, the bottom of which extending to the semiconductor substrate, and a second portion, the bottom of which extending to the lower diaphragm electrode.

Alternatively, the insulating layer includes a first opening at the upper electrode connection; the upper electrode in the insulating layer at the back plate is continuously distributed and embedded in the insulating layer at the first portion of the annular trench and the insulating layer at the upper electrode connection, and is exposed at the first opening.

Alternatively, the lower electrode connection comprises a contact hole that is extended to and connected with the lower diaphragm electrode, and is filled with a lower electrode lead. The top insulating layer at the second portion of the annular trench extends to cover the lower electrode lead and forms a second opening to partially expose the lower electrode lead to form a bond pad.

Alternatively, the upper electrode is completely enclosed by the insulating layer at the back plate.

Alternatively, the annular supporter is arranged concentric with the cavity.

Alternatively, the insulating layer at the back plate comprises downward-extended protrusions formed on the surface facing the lower diaphragm electrode.

Alternatively, each of the protrusions has a thickness ranges from 0.3 um to 1 um.

Alternatively, the lower diaphragm electrode and the upper electrode are conductive thin films.

Alternatively, the conductive thin films are metal thin films, or doped polysilicon thin films, or amorphous silicon thin films.

Alternatively, the upper electrode and the lower electrode lead are metal thin films made of the same material.

Alternatively, the lower diaphragm electrode has a circular shape with a diameter ranging from 200 um to 2 mm; the thickness of the lower diaphragm electrode ranges from 4000 Å to 3 um.

Alternatively, the upper electrode embedded in the back plate has a circular shape with a diameter ranging from 200um to 2mm; the thickness of the lower diaphragm electrode ranges from 4000 Å to 10 um.

Alternatively, the material of the insulating layer is silicon nitride.

Alternatively, the cavity has a shape of cylinder or cone having a diameter at the top ranging from 200 um to 1 mm and a depth ranging from 200 um to 700 um.

The present invention also provides a method of manufacturing the MEMS microphone structure mentioned above. The method comprises the following steps: forming a first dielectric layer, a lower diaphragm electrode and a second dielectric layer successively on a substrate; performing lithography and etching processes to form an annular trench, at least a part of the bottom of which extending to the lower diaphragm electrode while the rest of the bottom of which extending to the substrate, wherein an area enclosed by an inner sidewall of the annular trench forms a back plate region; depositing a first insulating layer, wherein the first insulating layer filled in the annular trench forms an annular supporter; depositing an upper electrode and patterning to form a patterned upper electrode covering at least a part of the first insulating layer within the back plate region; depositing a second insulating layer; forming an upper electrode connection and a lower electrode connection; etching to form multiple holes penetrating the first insulating layer and the second insulating layer within the back plate region to form a back plate; forming a cavity extending through the substrate, the top of which is within the area enclosed by the inner sidewall of the annular trench; and performing releasing process to remove the first dielectric layer and the second dielectric layer within the back plate region and above the cavity together, so as to form an air gap between the back plate and the lower diaphragm electrode.

Alternatively, the annular trench comprises a first portion formed outside the lower diaphragm electrode, the bottom of which extending to the semiconductor substrate, and a second portion, the bottom of which extending to the lower diaphragm electrode.

Alternatively, the patterned upper electrode is arranged continuously on the first insulating layer at the back plate region and the first insulating layer within the first portion of the annular trench, and is coated by the second insulating layer.

Alternatively, the step of forming the upper electrode connection comprises forming a first opening in the second insulating layer to expose the upper electrode filled in the first portion of the annular trench, so as to form the upper electrode connection at the first opening.

Alternatively, after the step of depositing the first insulating layer, the method further comprises: etching the first insulating layer and the second insulating layer at areas outside an outer periphery of the annular trench to form a contact hole the bottom of which extending to the lower diaphragm electrode.

Alternatively, the upper electrode is filled in the contact hole to be connected to the lower diaphragm electrode, and is coated by the second insulating layer.

Alternatively, the step of forming the lower electrode connection comprises forming a second opening in the second insulating layer to expose the upper electrode filled in the contact hole, so as to form the lower electrode connection at the second opening.

Alternatively, the step of depositing the upper electrode on the first insulating layer and patterning comprises etching to form multiple apertures in the upper electrode at the back plate region; wherein the second insulating layer is connected with the first insulating layer by filling the apertures.

Alternatively, the step of etching to form multiple holes penetrating the first insulating layer and the second insulating layer within the back plate region to form the back plate further comprises etching connecting portions of the first and second insulating layers to form the holes such that the upper electrode at the back plate region is completely coated by the first and second insulating layers.

Alternatively, before the step of performing lithography and etching processes to form the annular trench, the method further comprises etching the upper surface of the second dielectric layer within the area enclosed by the inner sidewall of the annular trench to form at least one recess.

Alternatively, the recess has a thickness ranging from 0.3 um to 1 um.

Alternatively, the step of forming the cavity extending through the substrate comprises: coating a removable protection material on the front side of the formed structure; etching the substrate from backside to form the cavity; and removing the protection material.

Alternatively, before the step of etching the substrate from backside to form the cavity, the method further comprises thinning the backside of the substrate to a certain thickness through polishing.

Alternatively, the step of etching the substrate from backside to form the cavity comprises: reversing the substrate to make the backside of the substrate facing up; coating photoresist on the backside of the substrate and performing exposure and development processes; performing etching to form the cavity by a Si trench etching equipment; and removing the photoresist.

Alternatively, the releasing process is a wet etching process or a vapor etching process.

Alternatively, the lower diaphragm electrode and the upper electrode are conductive thin films.

Alternatively, the conductive thin films are metal thin films, or doped polysilicon thin films, or amorphous silicon thin films.

Alternatively, the material of the first insulating layer and the second insulating layer is silicon nitride.

Alternatively, the cavity has a shape of cylinder or cone.

The advantage of the present invention is that by using the annular supporter, the releasing process for forming the air gap is stopped inside the annular supporter, such that peeling off of the lower diaphragm electrode due to a too long releasing time can be avoided. Furthermore, the first and second insulating layers completely enclose the upper electrode at the back plate, which provides protection to the upper electrode against damage during the releasing process.

DETAILED DESCRIPTION OF THE EMBODIMENTS

Reference will now be made in detail to the present preferred embodiments to provide a further understanding of the invention. The specific embodiments and the accompanying drawings discussed are merely illustrative of specific ways to make and use the invention, and do not limit the scope of the invention or the appended claims.

Firstly, the MEMS microphone structure of the present invention will be described in detail.

The MEMS microphone structure comprises a semiconductor substrate, a first dielectric layer, a lower diaphragm electrode, a lower electrode connection and an upper electrode structure. Wherein, a cavity is formed in the substrate by selectively removing part of the semiconductor substrate. The first dielectric layer is formed on the upper surface of the semiconductor substrate, having a through-hole communicating with the cavity. The lower diaphragm electrode is formed above the through-hole and at least partially connected with the upper surface of the first dielectric layer, such that the lower diaphragm electrode can be supported on the semiconductor substrate by the first dielectric layer. The lower diaphragm electrode is lead out through a lower electrode connection. The upper electrode structure is provided with an insulating layer, it comprises an annular supporter, a back plate having multiple holes, and an upper electrode connection. Wherein, an upper electrode is embedded in the insulating layer at the back plate and lead out by the upper electrode connection. At least a part of the annular supporter extends downwardly to the lower diaphragm electrode while the rest of the annular supporter extends downwardly to the substrate. The annular supporter can be an annular trench, or other annular structures. The back plate is suspended above the lower diaphragm electrode by the annular supporter, forming an air gap therebetween. With the annular supporter, the releasing process for forming the air gap will be stopped within the internal of the annular supporter automatically. Since the annular supporter is partially located on the lower diaphragm electrode, meaning that the lower diaphragm electrode extending beyond the internal of the annular supporter, part of the first dielectric layer below the lower diaphragm electrode is not removed when the releasing process is stopped, such that the lower diaphragm electrode will not be peeled off as it is supported on the semiconductor substrate by the non-removed first dielectric layer. Meanwhile the back plate can be suspended above the lower diaphragm electrode reliably through the supporter.

The MEMS microphone structure according to an embodiment of the present invention will be described in detail hereinafter.

Figure 1:
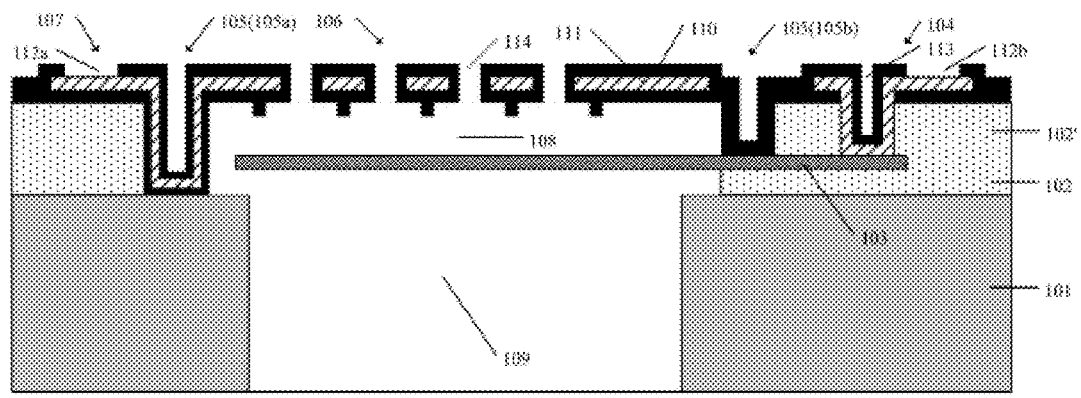
FIG. 1 is a diagram illustrating a MEMS microphone structure according to an embodiment of the present invention.

As shown in FIG. 1, the MEMS microphone structure comprises a semiconductor substrate 101, a first dielectric layer 102, a lower diaphragm electrode 103, a lower electrode connection 104 and an upper electrode structure. Wherein, a cavity 109 is formed in the substrate having a shape of cylinder or cone. The diameter of the top of the cavity 109 ranges from 200 um to 1 mm, the depth of the cavity ranges from 200 um to 700 um. The first dielectric layer 102 is formed on the upper surface of the semiconductor substrate 101, it has a through-hole communicating with the cavity 109. The lower diaphragm electrode 103 is formed above the through-hole and is supported on the semiconductor substrate 101 by the first dielectric layer 102. In the embodiment, on end of the lower diaphragm electrode 103 is suspended and the other end is attached to the upper surface of the first dielectric layer 102. In other embodiments, two ends of the lower diaphragm electrode can both be attached to the upper surface of the first dielectric layer. The lower diaphragm electrode is mainly round in shape with a diameter ranging from 200 um to 2 mm. The thickness of the lower diaphragm electrode can be 4000 Å to 3 um. The material of the first dielectric layer 102 can be silicon oxide grown by a thermal oxidation process, USG (un-doped silicon glass), PSG (Phosphosilicate Glass) or BPSG (boron Phosphosilicate Glass) deposited by PECVD. The lower diaphragm electrode 103 is formed by a conductive thin film, which can be a metal thin film such as Al, W, or Cu thin film, a doped polysilicon thin film, or an amorphous thin film. Preferably, in the embodiment, a low stressed doped polysilicon thin film is used as the lower diaphragm electrode 103 to obtain better sound pressure sensitivity.

The upper electrode structure is provided with an insulating layer 110, it comprises an annular supporter 105, a back plate 106, and an upper electrode connection 107. Wherein, an upper electrode 111 is embedded in the insulating layer 110 at the back plate 106, and it is lead out by the upper electrode connection 107. In the embodiment, the annular supporter is an annular trench, it comprises a first portion 105a which is formed outside the lower diaphragm electrode 103 and extends to the semiconductor substrate 101, and a second portion 105b which extends to the lower diaphragm electrode 103. The lower diaphragm electrode 103 extends beyond the second portion 105b in the horizontal direction. In other embodiments, the annular supporter can be totally arranged above the lower diaphragm electrode, the bottom of which extending to the lower diaphragm electrode. The back plate 106 is suspended above the lower diaphragm electrode 103 through the annular supporter 105, and an air gap 108 is formed between the back plate 106 and the lower diaphragm electrode 103. Preferably, the annular supporter is formed concentric with the cavity, so that the dielectric layer between the back plate and the lower diaphragm electrode can be completely removed in the subsequent releasing process for forming the air gap. Furthermore, the back plate 106 includes multiple holes 114 communicating with the air gap 108. Such holes 114 are used as acoustic holes for sound wave transmission when the lower diaphragm electrode 103 vibrates, they can be square holes or round holes. It is noted that, at these acoustic holes, the insulating layer 110 covers the top and bottom surfaces as well as the side surfaces of the upper electrode 111 so as to completely enclose the upper electrode 111. Accordingly, after performing the releasing process, releasing solution will not damage the upper electrode in the back plate. The upper electrode 111 in the back plate can be round in shape with a diameter less than or equal to the inner diameter of the annular trench, ranging from 200 um to 2 mm. In addition, in order to prevent the upper electrode in the back plate adhered to the lower diaphragm electrode in a humid environment (such as during a wet releasing process), the insulating layer 110 at the back plate is provided with multiple protrusions on its surface facing the lower diaphragm electrode 103. The thickness of these protrusions ranges from 0.3 um to 1 mm. The upper electrode 111 can be a conductive thin film, such as a metal thin film such as Al, W, or Cu thin film, a doped polysilicon thin film, or an amorphous thin film, having a thickness ranging from 4000 Å to 10 um. The material of the insulating layer 110 can be silicon nitride.

Please referring to FIG. 1, the insulating layer 110 has a first opening 112a at the upper electrode connection. The upper electrode 110 embedded within the insulating layer at the back plate is continuously distributed and embedded in the insulating layer at the first portion 105a of the annular trench and insulating layer at the upper electrode connection 107, and is exposed at the first opening 112a, so as to form the upper electrode connection at the first opening 112a.

The lower electrode connection 104 comprises a contact hole 113 that is extended to and connected with the lower diaphragm electrode and an upper metal line. The contact hole 113 is filled with a lower electrode lead to lead out the lower diaphragm electrode 103. The top insulating layer 110 at the second portion 105b of the annular trench extends to cover the lower electrode lead and forms a second opening 112b to partially expose the lower electrode lead and forms a bond pad of the lower electrode, so as to form the lower electrode connection at the second opening 112b. Preferably, the upper electrode and the lower electrode lead are metal thin films made of the same material, such that they can be formed integrally.

Next, the method of manufacturing the MEMS microphone structure will be described in detail accompanied by a specific embodiment. For better understanding the present invention, please refer to FIGS. 2-12 which are cross section views illustrating the manufacturing steps of the method according to an embodiment of the present invention.

Figure 2:
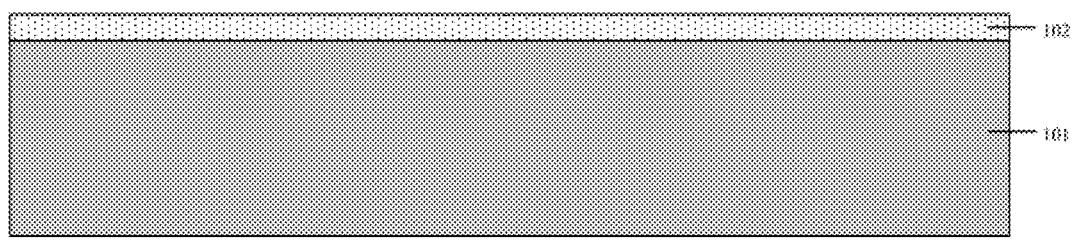
FIGS. 2-12 are cross sectional views of the MEMS microphone structure illustrating the manufacturing steps of the MEMS microphone structure according to an embodiment of the present invention.

Firstly, referring to FIG. 2, a first dielectric layer 102 is deposited on a semiconductor substrate 101. The material of the substrate 101 can be silicon, germanium, or silicon germanium. The material of the first dielectric layer 102 can be silicon oxide grown by a thermal oxidation process, USG (un-doped silicon glass), PSG (Phosphosilicate Glass) or BPSG (boron Phosphosilicate Glass) deposited by PECVD.

Figure 3:
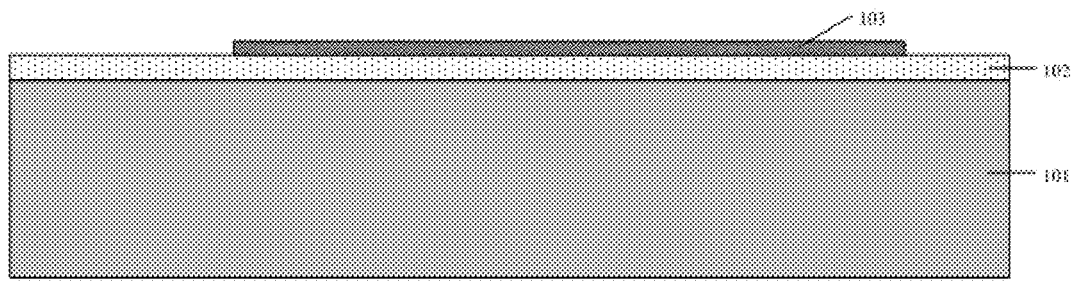

Referring to FIG. 3, a lower diaphragm electrode material is deposited on the first dielectric layer 102 and then patterned to form a lower diaphragm electrode 103. The lower diaphragm electrode 103 is mainly round in shape with a diameter of 200 um to 2 mm. The thickness of the lower diaphragm electrode ranges from 4000 Å to 3 um. The lower diaphragm electrode can be a metal thin film such as Al, W, or Cu thin film, a doped polysilicon thin film, or an amorphous thin film. Preferably, in the embodiment, a low stressed doped polysilicon thin film is used to obtain better sound pressure sensitivity. In the case where the metal thin film, which has comparatively high stress, is used, the dielectric layer 102 is firstly etched to form patterns of certain depth, and then the metal thin film is deposited to form a corrugated metal thin film with lower stress and higher sound pressure sensitivity.

Figure 4:
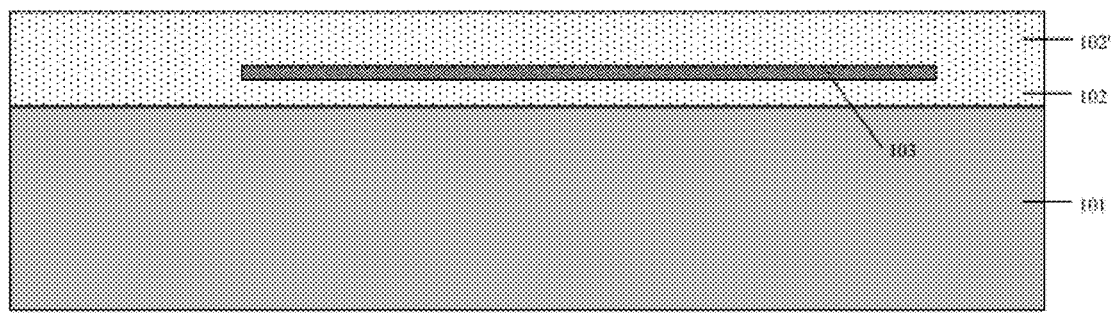

Referring to FIG. 4, a second dielectric layer 102' is deposited on the lower diaphragm electrode 103 and the first dielectric layer 102. The second dielectric layer 102' is used as a sacrificial layer between the diaphragm and the back plate of the MEMS microphone structure, its thickness defines the height of the air gap between the diaphragm and the back plate of the finished product. The material of the second dielectric layer 102' can also be silicon oxide grown by a thermal oxidation process, USG (un-doped silicon glass), PSG (Phosphosilicate Glass) or BPSG (boron Phosphosilicate Glass) deposited by PECVD.

Figure 5:
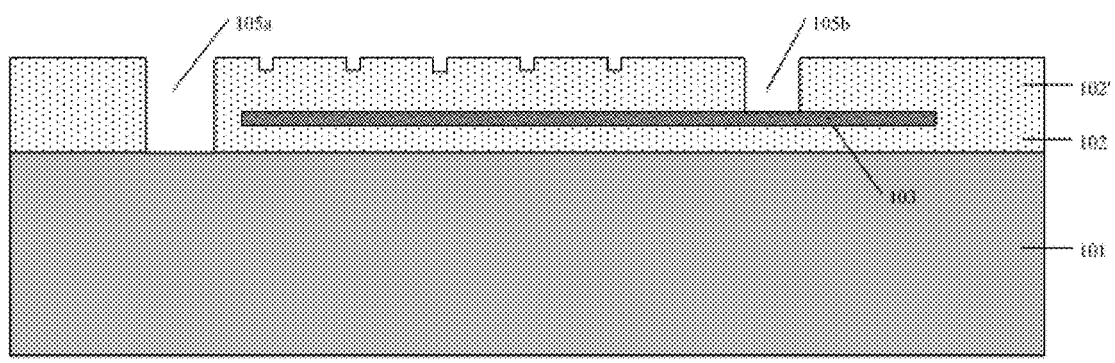

As shown in FIG. 5, an annular trench is formed by etching the dielectric layers 102, 102'. The area enclosed by an inner sidewall of the annular trench is used as a back plate region of the MEMS microphone structure, while the area outside the outer sidewall of the annular trench is used as an electrical connection region of the MEMS microphone structure. Wherein, at least a part of the bottom of the annular trench extends downwardly to the lower diaphragm electrode 103, while the rest of the bottom of the annular trench extends downwardly to the substrate. Therefore, the lower diaphragm electrode 103 partially extends beyond the inner sidewall of the annular trench in the horizontal direction. In the embodiment, the annular trench includes a first portion 105a formed outside the lower diaphragm electrode 103 and stopped at the semiconductor substrate, and a second portion 105b stopped at the lower diaphragm electrode 103. The lower diaphragm electrode 103 extends beyond the inner sidewall of the second portion 105b in the horizontal direction. In other embodiments, the bottom of the annular trench can be wholly extended to the lower diaphragm electrode. In addition, before etching to form the annular trench, the second dielectric layer 102' can be etched to form uniformly distributed square recesses or round recesses therein with a depth ranging from 0.3 um to 1 um (not greater than the thickness of the second dielectric layer 102'), so as to prevent the upper electrode deposited later adhered to the lower diaphragm electrode 103 in a humid environment (such as during a wet releasing process).

Figure 6:
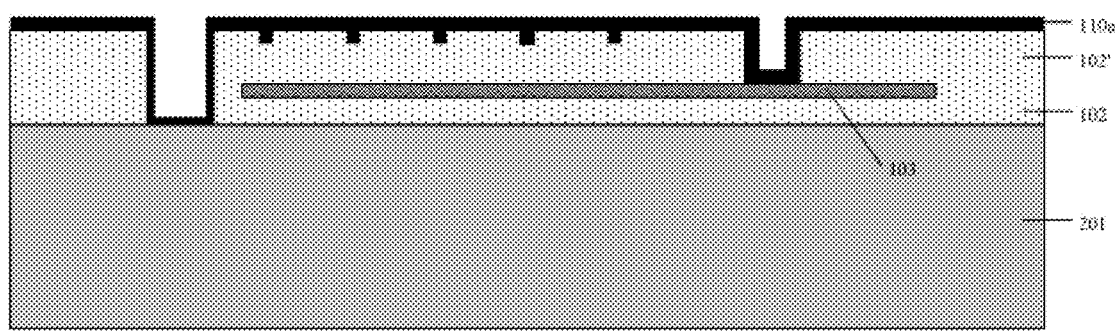

Referring to FIG. 6, a first insulating layer 110a is deposited on the patterned dielectric layers 102, 102'. The first insulating layer 110a is silicon nitride deposited by PECVD or LPCVD. The first insulating layer 110a filled within the annular trench used to form the annular supporter of the MEMS microphone structure.

Figure 7:
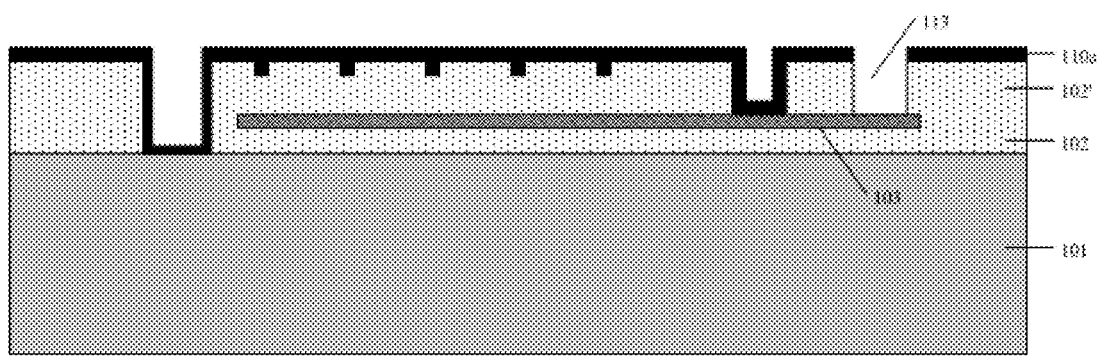

Referring to FIG. 7, the dielectric layers 102, 102' and the first insulating layer 110a at the electrical connection region is etched to form a contact hole 113 extending to the lower diaphragm electrode 103 for forming a lower electrode connection.

Figure 8:
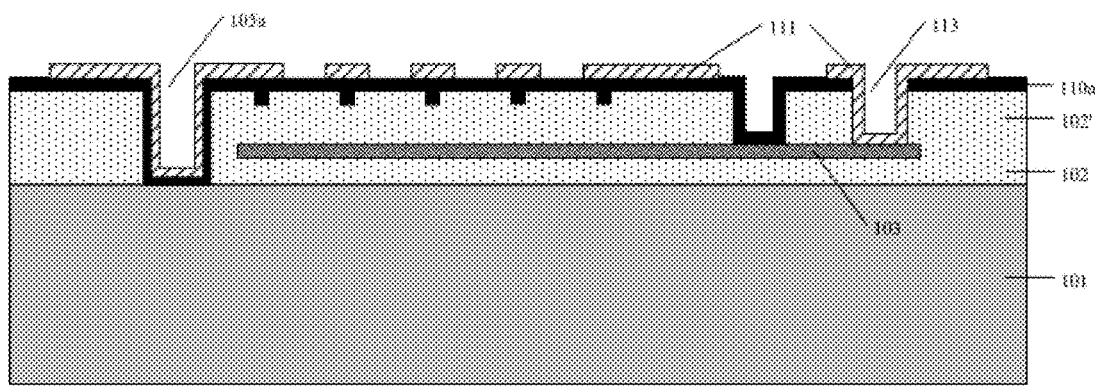
Figure 9:
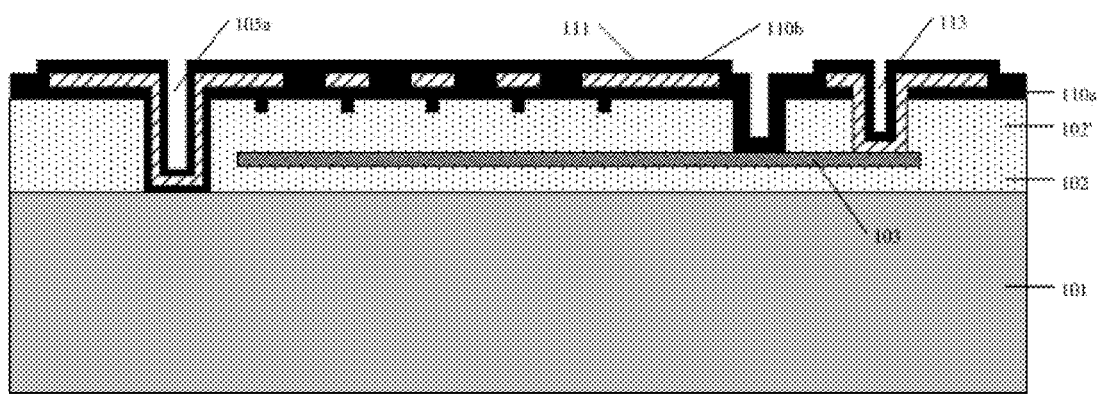

Then, referring to FIGS. 8 and 9, an upper electrode 111 is deposited and patterned, and then a second insulating layer 110b is deposited. The second insulating layer 110b can be silicon nitride deposited by PECVD or LPCVD. The patterned upper electrode 111 covers at least a part of the first insulating layer 110a at the back plate region, and is coated by the second insulating layer 110b. On the other hand, the upper electrode is also continuously distributed and embedded between the first and second insulating layers at the back plate region as well as the first and second insulating layers at the first portion 105a of the annular trench, such that the upper electrode can also be used to form an upper electrode connection. In addition, the upper electrode 111 is also filled in the contact hole 113 to form the lower electrode connection. Preferably, the step of depositing the upper electrode 111 and patterning comprises etching the upper electrode at the back plate region to form uniformly distributed round apertures or square apertures, then depositing the second insulating layer 110b to fill these round apertures or square apertures to communicate with the first insulating layer 110a. In the embodiment, the second portion 105b of the annular trench is not provided with the upper electrode 111. However, in other embodiments, the upper electrode 111 can also be embedded between the first insulating layer 110a and the second insulating layer 110b at the second portion of the annular trench. The upper electrode can be a metal thin film such as Al, W, or Cu thin film, a doped polysilicon thin film, or an amorphous thin film. Preferably, the metal thin film is used, so that additional metal films or metal wires to lead out the lower electrode is not required and the process complexity is greatly reduced since the metal thin film itself can be used directly as the lower electrode lead.

Figure 10:
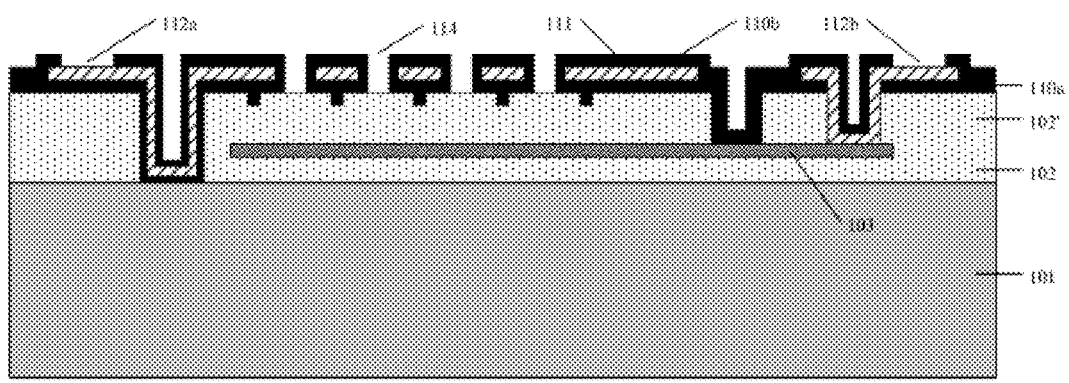

Then, referring to FIG. 10, the first insulating layer 110a and the second insulating layer 110b are patterned to from the back plate, the upper electrode connection and the lower electrode connection of the MEMS microphone structure. Specifically, the connecting portion of the first insulating layer 110a and the second insulating layer 110b at the back plate region (the portion excluding the upper electrode 111) is etched to from holes 114, and thus the back plate of the MEMS microphone structure is formed. These holes 114 are used as acoustic holes for sound wave transmission when the lower diaphragm electrode 103 vibrates, they can be square holes or round holes. By this time, the two insulating layers at the back plate region still cover the top and bottom surfaces as well as the side surfaces of the upper electrode 111 so as to completely enclose the upper electrode 111. Since the upper electrode in the back plate is not exposed, it will not be damaged by the strong corrosive releasing solution during the subsequent releasing process. After that, first and second openings 112a, 112b for forming electrode connections are formed by etching the second insulating layer 110b outside the back plate. The first opening 112a is close to the first portion of the annular trench, the second opening 112b is close to the second portion of the annular trench. As a result, the upper electrode 111 filled in the first portion of the annular trench is exposed in the first opening 112a, and the upper electrode 111 filled in the contact hole and connected to the lower diaphragm electrode is exposed in the second opening 112b, such that the upper electrode connection is formed at the first opening 112a, the lower electrode connection is formed at the second opening 112b. In other embodiments, the first opening can also be formed in the second insulating layer at the first portion of the annular trench, the second opening can also be formed in the second insulating layer at the contact hole.

Figure 11:
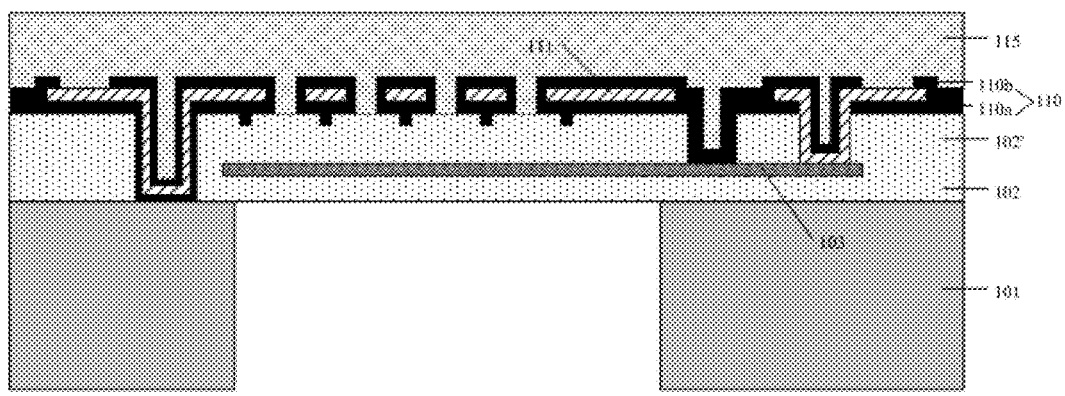

Referring to FIG. 11, the backside of the substrate 101 is patterned to form a cavity 109 extending through the substrate. Specifically, firstly a removable protection material 115 is coated on the already formed structure to protect its front side, then the cavity 109 is formed by etching the portion of the backside of the substrate 101 corresponding to the back plate, after that, the protection material 115 is removed. Wherein, the step of etching the substrate to form the cavity comprises disposing the substrate with its backside facing up; coating photoresist on the backside of the substrate and performing exposure and development processes; etching to completely remove the exposed silicon of the substrate by a Si trench etching equipment; and removing the photoresist. The cavity 109 can be a cylinder or cone having a top portion inside the internal of the area enclosed by the inner sidewall of the annular trench with a diameter ranging from 200 um to 1 mm. The depth of the cavity ranges from 200 um to 700 um. Preferably, the cavity 109 is concentric with the annular trench. The protection material can be photoresist or blue tape.

Figure 12:
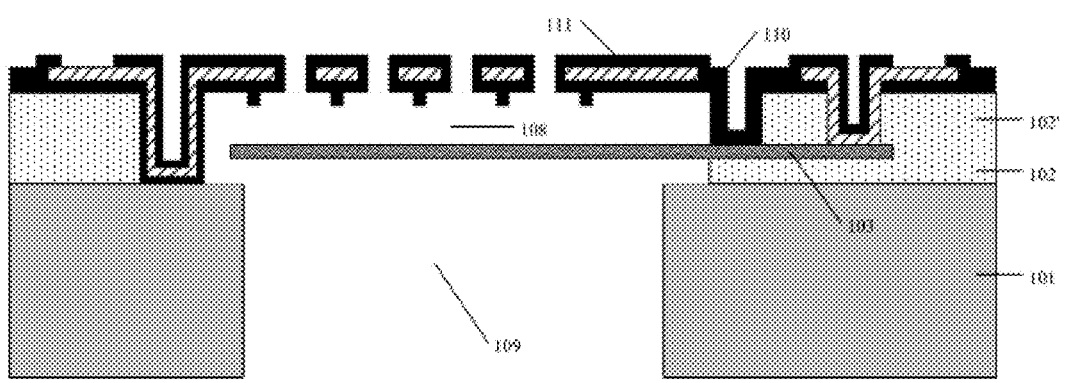

Finally, referring to FIG. 12, using wet etching process or vapor etching process to release and remove the first and second dielectric layers 102, 102' above the cavity. The wet etchant for releasing can be HF solution or mixed BOE solution comprising HF and NH$_4$F. As a result, a through-hole communicating with the cavity is formed below the back plate, the air gap 108 is formed between the lower diaphragm 103 and the back plate, and finally forms the MEMS microphone structure as shown in FIG. 1. With the insulating layer 110 filled in the annular trench, the releasing process for forming the air gap is stopped inside the annular supporter formed by the insulating layer 110 automatically, and the thin first dielectric layer below the lower diaphragm electrode 103 will be etched restrictedly during the releasing process due to the small opening exposed to the react liquid or gas. Therefore, portion of the first dielectric layer 12 is not removed, and the lower diaphragm electrode 103 can be supported on the semiconductor substrate by the remaining portion of the first dielectric layer, meanwhile the back plate 106 can be suspended above the lower diaphragm electrode 103 reliably through the supporter.

In summary, compared with the conventional technologies, the MEMS microphone structure of the present invention can be easily manufactured, and the upper electrode and the lower diaphragm electrode can be protected from damage or peeling off during the releasing process.

While this invention has been particularly shown and described with references to preferred embodiments thereof, if will be understood by those skilled in the art that various changes in form and details may be made herein without departing from the spirit and scope of the invention as defined by the appended claims.

The invention claimed is:

1. A MEMS microphone structure comprising:
a semiconductor substrate having a cavity therein;
a first dielectric layer formed on the semiconductor substrate having a through-hole communicating with the cavity;
a lower diaphragm electrode formed above the through-hole and at least partially attached to an upper surface of the first dielectric layer, wherein the lower diaphragm electrode is lead out through a lower electrode connection; and
an upper electrode structure with an insulating layer, wherein the upper electrode structure comprises an annular supporter, a back plate having multiple holes, and an upper electrode connection; wherein at least a part of the annular supporter extends downwardly to the lower diaphragm electrode while the rest of the annular supporter extends downwardly to the semiconductor substrate; the back plate is suspended above the lower diaphragm electrode by the annular supporter, forming an air gap therebetween; an upper electrode is embedded in the insulating layer at the back plate and is lead out by the upper electrode connection;
wherein the annular supporter is an annular trench; the annular trench comprises a first portion formed outside the lower diaphragm electrode, the bottom of which extending to the semiconductor substrate; the insulating layer includes a first opening at the upper electrode connection; the upper electrode in the insulating layer at the back plate is continuously distributed and embedded in the insulating layer at the first portion of the annular trench and in the insulating layer at the upper electrode connection, and is exposed at the first opening.

2. The MEMS microphone structure according to claim 1, wherein the annular trench comprises a second portion, the bottom of which extending to the lower diaphragm electrode.

3. The MEMS microphone structure according to claim 2, wherein the lower electrode connection comprises a contact hole that is extended to and connected with the lower diaphragm electrode, the contact hole is filled with a lower electrode lead to lead out the lower diaphragm electrode; the insulating layer at the second portion of the annular trench extends to cover the lower electrode lead and forms a second opening to partially expose the lower electrode lead.

4. The MEMS microphone structure according to claim 1, wherein the upper electrode is completely enclosed by the insulating layer at the back plate.

5. The MEMS microphone structure according to claim 1, wherein the annular supporter is arranged concentric with the cavity.

6. The MEMS microphone structure according to claim 1, wherein the insulating layer at the back plate comprises downward-extended protrusions formed on the surface facing the lower diaphragm electrode, wherein each of the protrusions has a thickness ranges from 0.3 um to 1 um.

7. The MEMS microphone structure according to claim 3, wherein the lower diaphragm electrode and the upper electrode are conductive thin films, the conductive thin films are metal thin films, or doped polysilicon thin films, or amorphous silicon thin films; wherein the material of the insulating layer is silicon nitride.

8. The MEMS microphone structure according to claim 3, wherein the upper electrode and the lower electrode lead are metal thin films made of the same material.

9. The MEMS microphone structure according to claim 1, wherein the lower diaphragm electrode has a circular shape with a diameter ranging from 200 um to 2 mm; the thickness of the lower diaphragm electrode ranges from 4000 Å to 3 um; the upper electrode embedded in the back plate has a circular shape with a diameter ranging from 200 um to 2 mm; the thickness of the lower diaphragm electrode ranges from 4000 Å to 10 um; the cavity has a shape of cylinder or cone with a diameter at the top ranging from 200 um to 1 mm and a depth ranging from 200 um to 700 um.

10. A method of manufacturing a MEMS microphone structure comprising the following steps:
   forming a first dielectric layer, a lower diaphragm electrode and a second dielectric layer successively on a substrate;
   performing lithography and etching processes to form an annular trench, at least a part of the bottom of which extending to the lower diaphragm electrode while the rest of the bottom of which extending to the substrate, wherein an area enclosed by an inner sidewall of the annular trench forms a back plate region;
   depositing a first insulating layer, wherein the first insulating layer filled in the annular trench forms an annular supporter;
   depositing an upper electrode and patterning to form a patterned upper electrode covering at least a part of the first insulating layer within the back plate region;
   depositing a second insulating layer;
   forming an upper electrode connection and a lower electrode connection;
   etching to form multiple holes penetrating the first insulating layer and the second insulating layer within the back plate region to form a back plate;
   forming a cavity extending through the substrate, the top of which is within the area enclosed by the inner sidewall of the annular trench; and
   performing releasing process to remove the first dielectric layer and the second dielectric layer within the back plate region and above the cavity together, so as to form an air gap between the back plate and the lower diaphragm electrode.

11. The method according to claim 10, wherein the annular trench comprises a first portion formed outside the lower diaphragm electrode, the bottom of which extending to the semiconductor substrate, and a second portion, the bottom of which extending to the lower diaphragm electrode.

12. The method according to claim 11, wherein the patterned upper electrode is arranged continuously on the first insulating layer at the back plate region and the first insulating layer within the first portion of the annular trench, and is coated by the second insulating layer.

13. The method according to claim 12, wherein the step of forming the upper electrode connection comprises forming a first opening in the second insulating layer to expose the upper electrode filled in the first portion of the annular trench, so as to form the upper electrode connection at the first opening.

14. The method according to claim 10, wherein after the step of depositing the first insulating layer, the method further comprises: etching the first insulating layer and the second insulating layer at areas outside an outer periphery of the annular trench to form a contact hole the bottom of which extending to the lower diaphragm electrode; wherein the upper electrode is filled in the contact hole to be connected to the lower diaphragm electrode, and is coated by the second insulating layer; wherein the step of forming the lower electrode connection comprises forming a second opening in the second insulating layer to expose the upper electrode filled in the contact hole, so as to form the lower electrode connection at the second opening.

15. The method according to claim 10, wherein the step of depositing the upper electrode on the first insulating layer and patterning comprises etching to form multiple apertures in the upper electrode at the back plate region; wherein the second insulating layer is connected with the first insulating layer by filling the apertures; wherein the step of etching to form multiple holes penetrating the first insulating layer and the second insulating layer within the back plate region to form the back plate further comprises etching connecting portions of the first and second insulating layers to form the holes such that the upper electrode at the back plate region is completely coated by the first and second insulating layers.

16. The method according to claim 10, wherein before the step of performing lithography and etching processes to form the annular trench, the method further comprises etching the upper surface of the second dielectric layer within the area enclosed by the inner sidewall of the annular trench to form at least one recess; wherein the recess has a thickness ranging from 0.3 um to 1 um.

17. The method according to claim 10, wherein the step of forming the cavity extending through the substrate comprises:
   coating a removable protection material on the front side of the formed structure;
   thinning the backside of the substrate to a certain thickness through polishing;
   etching the substrate from backside to form the cavity; and
   removing the protection material;
   wherein the step of etching the substrate from backside to form the cavity comprises:
   reversing the substrate to make the backside of the substrate facing up;
   coating photoresist on the backside of the substrate and performing exposure and development processes;
   performing etching to form the cavity by a Si trench etching equipment; and
   removing the photoresist.

18. The method according to claim 10, wherein the releasing process is a wet etching process or a vapor etching process.

19. The method according to claim 10, wherein the lower diaphragm electrode and the upper electrode are conductive thin films; the conductive thin films are metal thin films, or doped polysilicon thin films, or amorphous silicon thin films; wherein the material of the first insulating layer and the second insulating layer is silicon nitride; wherein the cavity has a shape of cylinder or cone.

* * * * *